(12) United States Patent
Chiu et al.

(10) Patent No.: US 6,515,552 B1
(45) Date of Patent: Feb. 4, 2003

(54) VOLTAGE CONTROL OSCILLATOR WITH STABLE FREE RUN FREQUENCY USING CURRENT CLAMPING

(75) Inventors: Hon Kin Chiu, Hayward, CA (US); Peyman Hojabri, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 40 days.

(21) Appl. No.: 09/675,311

(22) Filed: Sep. 29, 2000

(51) Int. Cl.[7] .................................................. H03L 7/08
(52) U.S. Cl. ............................ 331/175; 331/57; 331/17; 331/34; 331/185; 327/156
(58) Field of Search ............................ 331/17, 25, 175, 331/57, 34, 185; 327/538, 156

(56) References Cited

U.S. PATENT DOCUMENTS 5,629,650 A * 5/1997 Gersbach et al. ............. 331/17
5,740,213 A * 4/1998 Dreyer ........................ 375/374

* cited by examiner

Primary Examiner—Arnold Kinkead
(74) Attorney, Agent, or Firm—Wildman, Harrold, Allen & Dixon (57) ABSTRACT

An integrated circuit with a voltage-controlled oscillator that provides an oscillation signal with an unmodulated frequency that remains constant in response to reception of a bias current having a constant magnitude and with a modulated frequency that varies in response to reception of a modulation voltage. A current-to-voltage (I:V) conversion stage converts a bias clamp current to a control voltage. A voltage-to-current (V:I) conversion stage receives the control voltage and an external modulation voltage signal and generates the control current for a current-controlled oscillator (ICO). The control voltage is based upon the threshold voltage of one of the semiconductor devices forming the I:V conversion stage and is used to drive the V:I conversion stage so long as the external modulation voltage signal is substantially zero. Upon full assertion of the external modulation voltage signal, the output of the I:V conversion stage becomes disabled, thereby allowing the external modulation voltage signal to drive the V:I conversion stage. Since all of the semiconductor devices that form the I:V and V:I stages and ICO are integrated in one chip, they will all be similarly affected by any variations in operating characteristics caused by variations in operating temperatures or processes of fabrication of the semiconductor devices. Therefore, the unmodulated, or free running, frequency of the ICO output is defined by the bias clamp current substantially irrespective of such temperature or fabrication process variations.

21 Claims, 5 Drawing Sheets

VOLTAGE CONTROL OSCILLATOR WITH STABLE FREE RUN FREQUENCY USING CURRENT CLAMPING

BACKGROUND OF THE INVENTION

1. Field of the Invention

The present invention relates to voltage controlled oscillator (VCO) circuits, and in particular, to VCO circuits using circuit parameter clamping techniques for stabilizing free run frequencies.

2. Description of the Related Art

Figure 1:
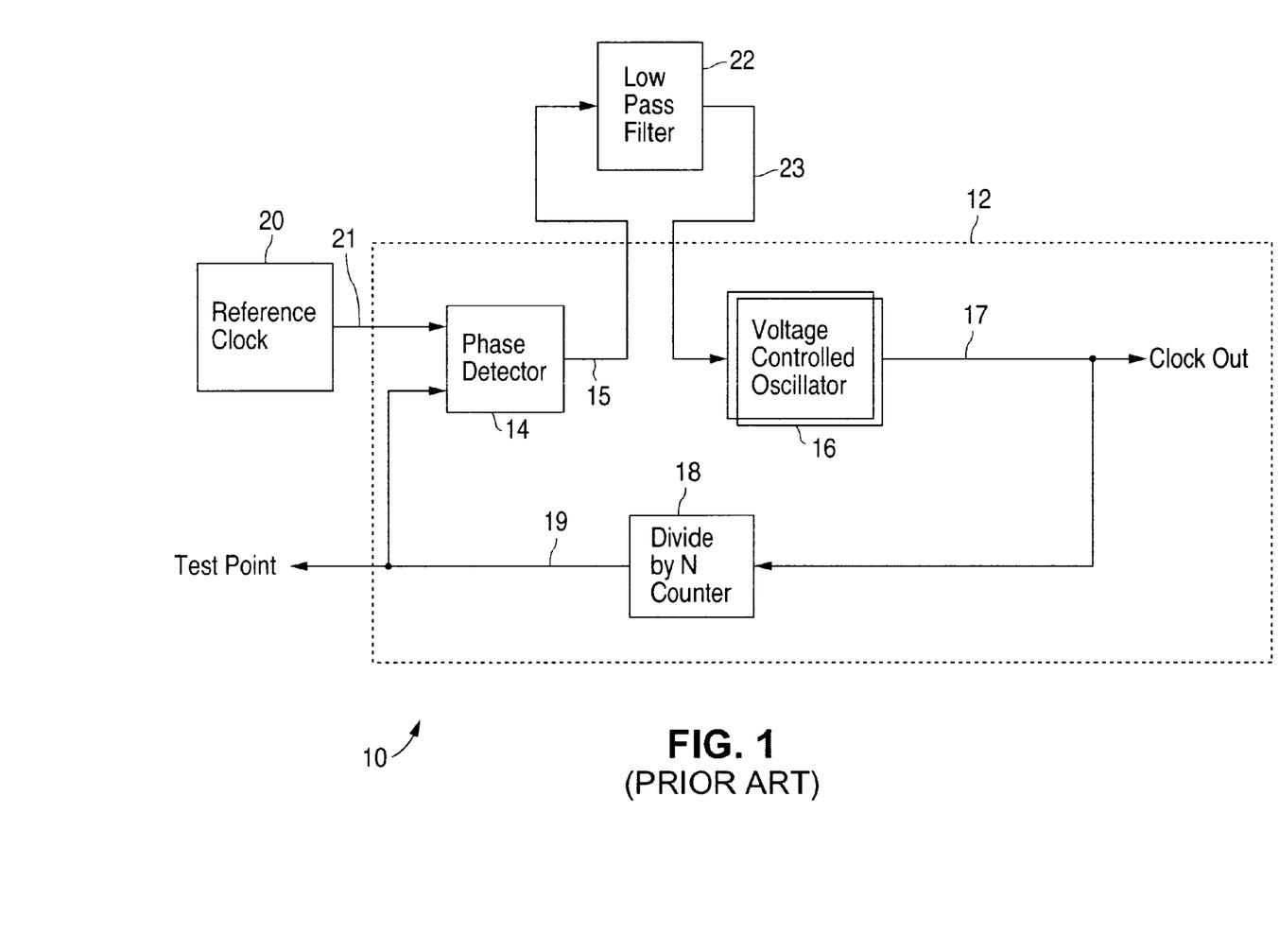
FIG. 1 is a functional block diagram of a conventional phase lock loop circuit.

Referring to FIG. 1, a typical phase lock loop (PLL) circuit 10 includes an integrated circuit 12 having a phase detector 14, VCO 16 and feedback divider 18 integrated therein and interconnected substantially as shown. In accordance with well-known conventional PLL principles, a referenced clock source 20 provides a reference clock signal 21. The phase detector 14 compares this signal 21 with a feedback signal 19 which is generally a frequency-divided version of the output signal 17 from the VCO. The feedback divider 18 is typically a counter that is programmable as to the divisor by which the frequency of the VCO signal 17 is divided.

The phase detector output signal 15 includes a DC component representing the phase difference between the two input signals 21, 19, plus numerous higher frequencies components as well. These higher frequency components are filtered out using a low pass filter 22 which is external to the integrated circuit 12. It is the low pass filtered signal 23, which is essentially a virtual DC signal, that is used to drive the VCO 16 and thereby control the frequency of its output signal 17.

Frequently, this type of circuit 10 is used in a free running, or "unmodulated," mode in which the output signal 15 from the phase detector 14, which is a "modulation" signal inasmuch as it is used to control, e.g., "modulate," the frequency of the VCO 16, is disabled or otherwise disconnected. This is done so as to allow the VCO 16 to run in its free run, or unmodulated, mode. Ideally, it is generally desirable that the frequency of the VCO signal remain substantially constant during this mode of operation. However, due to a number of factors, this is often not the case. For example, as is well known, the semiconductor devices used to implement the VCO 16 have a number of operating characteristics (e.g., threshold voltage, saturation voltage and current, channel resistivity, etc.) that can be affected by many things, including variations in ambient operating temperature and variations in the fabrication processes used to fabricate the semiconductor devices. As a result, the frequency of the VCO 17 can have variations in its frequency introduced.

Figure 2:
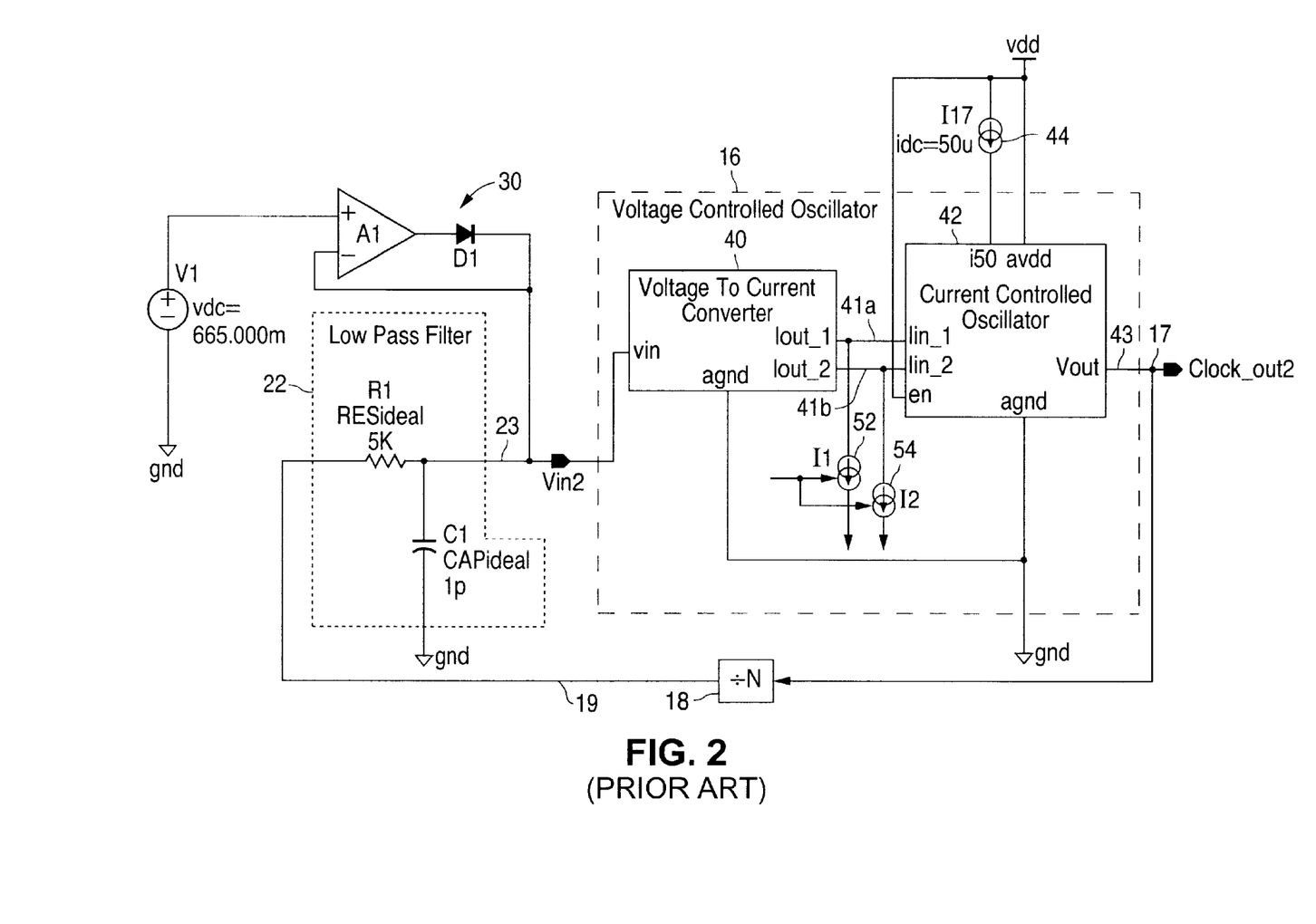
FIG. 2 is a functional block diagram depicting two conventional techniques for clamping a voltage-controlled oscillator during free run operation.

Referring to FIG. 2, at least two conventional techniques have been developed to address this problem. (As indicated, a common implementation of a VCO 16 includes a voltage-to-current (V:I) conversion circuit 40 that converts the input control voltage 23 to one or more control currents 41a, 41b, which, in turn, control the operating frequency of a current controlled oscillator (ICO) 42.) One technique involves the use of a DC voltage source 30 to apply a clamping voltage at the input 23 of the VCO 16. This is achieved by using an operational amplifier A1 with a diode D1 in its feedback circuit to buffer an input DC voltage and apply it to the input 23 of the VCO 16. As a solution, however, this technique is only partially successful. For example, variations in the operating characteristics of the semiconductor devices within the VCO 16, e.g., as caused by variations in operating temperature or fabrication processes, will cause the frequency of the VCO signal 17 to vary, notwithstanding the constant DC voltage at the input 23.

Another technique involves the use of current clamping by mixing static currents 11, 12 with the individual output currents 41a, 41b of the V:I converter 40 within the VCO 16. However, this approach also is only partially successful. The VCO 16 will often still have poor phase jitter performance due to the difficulty in generating a low noise static current, i.e., using current sources 52 and 54, in those applications involving mixed signal circuits or high-speed large signal analog amplifier circuits.

Accordingly, it would be desirable to have a technique for clamping a voltage or current controlled oscillator in such a manner as to significantly reduce any frequency variations or phase jitter introduced by variations in semiconductor device operating characteristics or on-chip noise.

SUMMARY OF THE INVENTION

An integrated circuit with a voltage-controlled oscillator that provides an oscillation signal with an unmodulated frequency that remains constant in response to reception of a bias current having a constant magnitude and with a modulated frequency that varies in response to reception of a modulation voltage, in accordance with one embodiment of the present invention, includes a current-to-voltage conversion circuit, a voltage-to-current conversion circuit and a current-controlled oscillator circuit. The current-to-voltage conversion circuit includes a portion of a plurality of integrated, like semiconductor devices with a plurality of operating characteristics and generates, in response to reception of a bias current, a control voltage with a magnitude corresponding to a magnitude of the bias current. The voltage-to-current conversion circuit includes another portion of the plurality of integrated, like semiconductor devices, is coupled to the current-to-voltage conversion circuit and generates, in response to reception of the control voltage and a modulation voltage, a control current with a magnitude that corresponds to a magnitude of the modulation voltage during reception of the modulation voltage; and corresponds to the control voltage magnitude otherwise The current-controlled oscillator circuit includes still another portion of the plurality of integrated, like semiconductor devices, is coupled to the voltage-to-current conversion circuit and generates, in response to reception of the control current, an oscillation signal with an unmodulated frequency corresponding to the bias current magnitude and with a modulated frequency corresponding to the modulation voltage. The unmodulated frequency is defined by the bias current magnitude substantially irrespective of variations in respective ones of the plurality of operating characteristics caused by variations in operating temperatures and processes of fabrication of the plurality of integrated, like semiconductor devices.

DETAILED DESCRIPTION OF THE INVENTION

Figure 3:
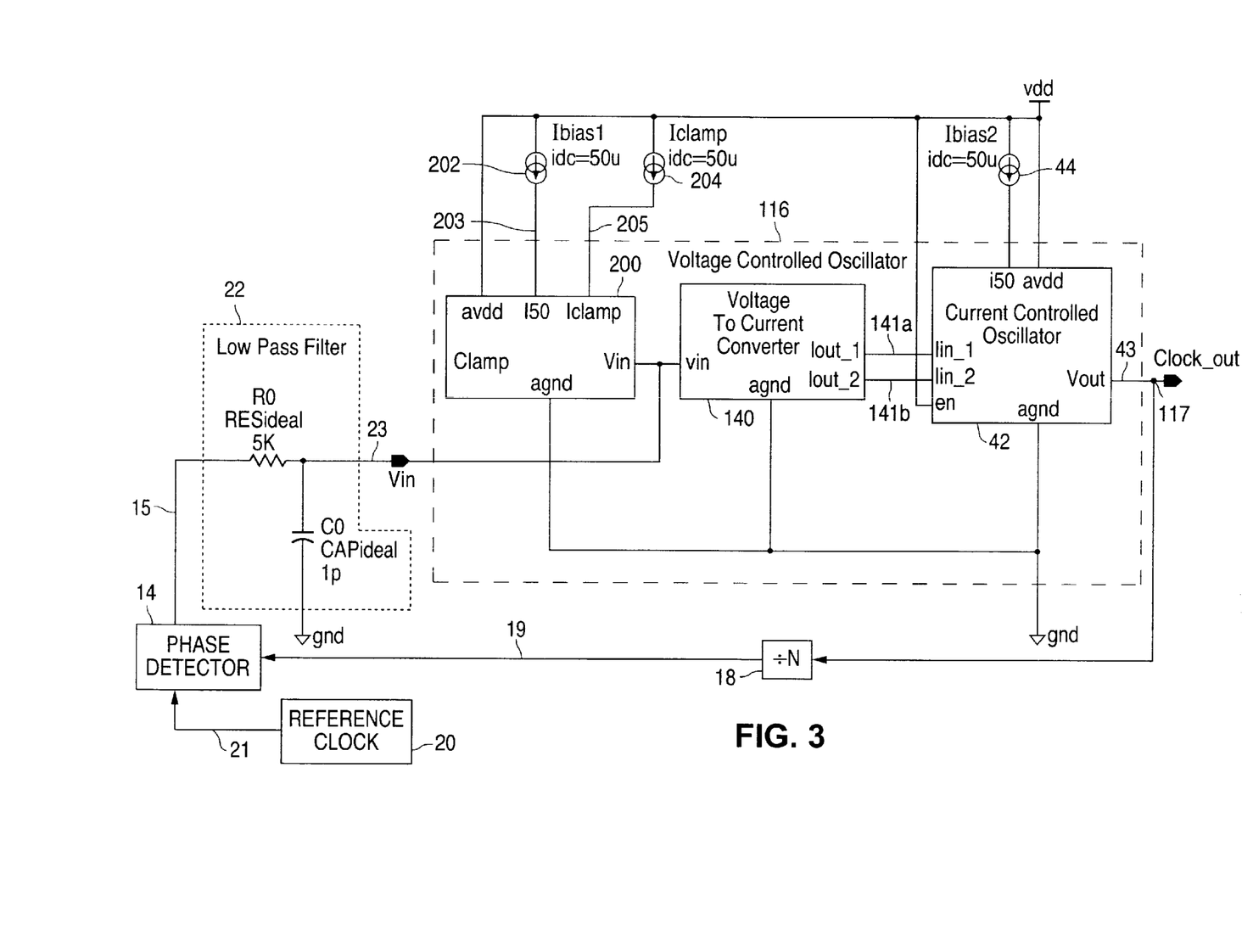
FIG. 3 is a functional block diagram of a current clamping technique for a voltage-controlled oscillator in accordance with one embodiment of the present invention.

Referring to FIG. 3, a VCO 116 with improved free run frequency stability and phase jitter performance in accordance with the present invention includes a current clamp circuit 200 for clamping the voltage at the input 23 of the VCO 116. (As per the conventional circuit of FIG. 1, the phase detector 14 and reference clock source 20 are shown. However, further as per FIG. 2 and as noted above, it will be understood that during the free running, or "unmodulated," mode of operation, the output signal 15 from the phase detector 14 is not used.) The current clamp circuit 200 receives, in addition to the power supply voltage VDD, two bias currents 203, 205 provided by two external current source circuits 202, 204. As discussed in more detail below, the clamped input voltage 23 is converted to dual output currents 141a, 141b by the V:I converter 140. These control currents 141a, 141b are used in a conventional manner by the ICO 42 to generate an oscillator signal 43 which serves as the VCO output signal 117.

Figure 4:
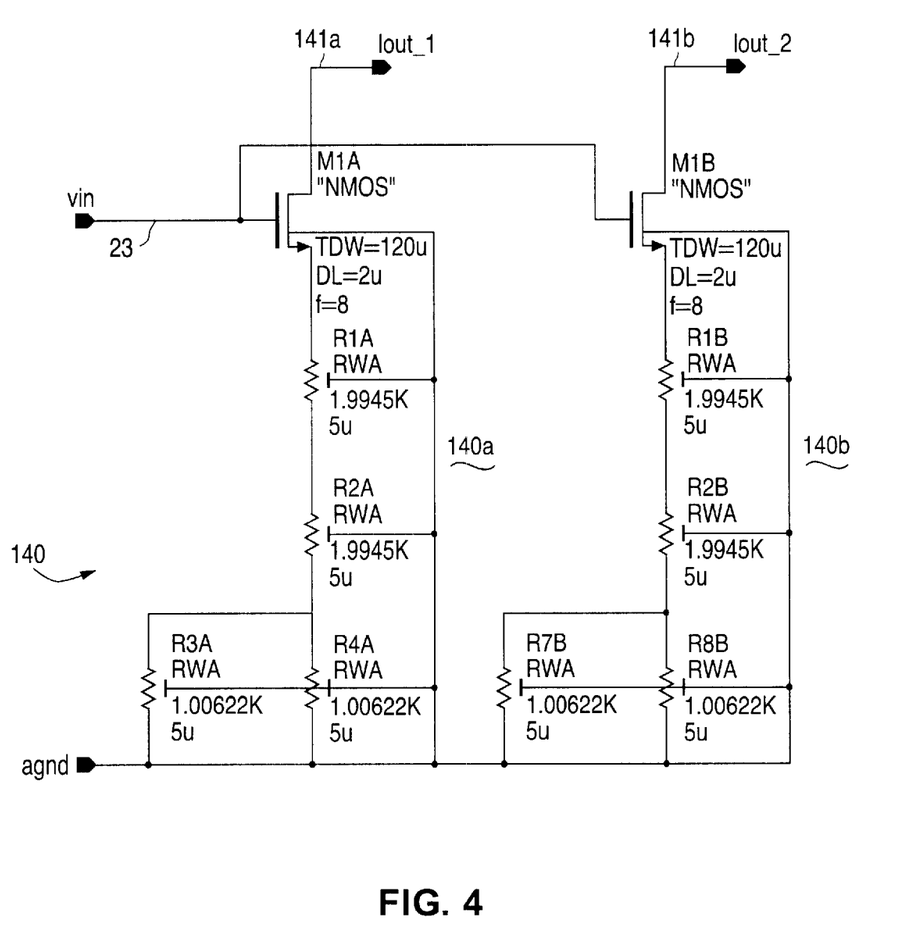
FIG. 4 is a schematic diagram of one example of a voltage-to-current converter for use in the circuit of FIG. 3.
Figure 5:
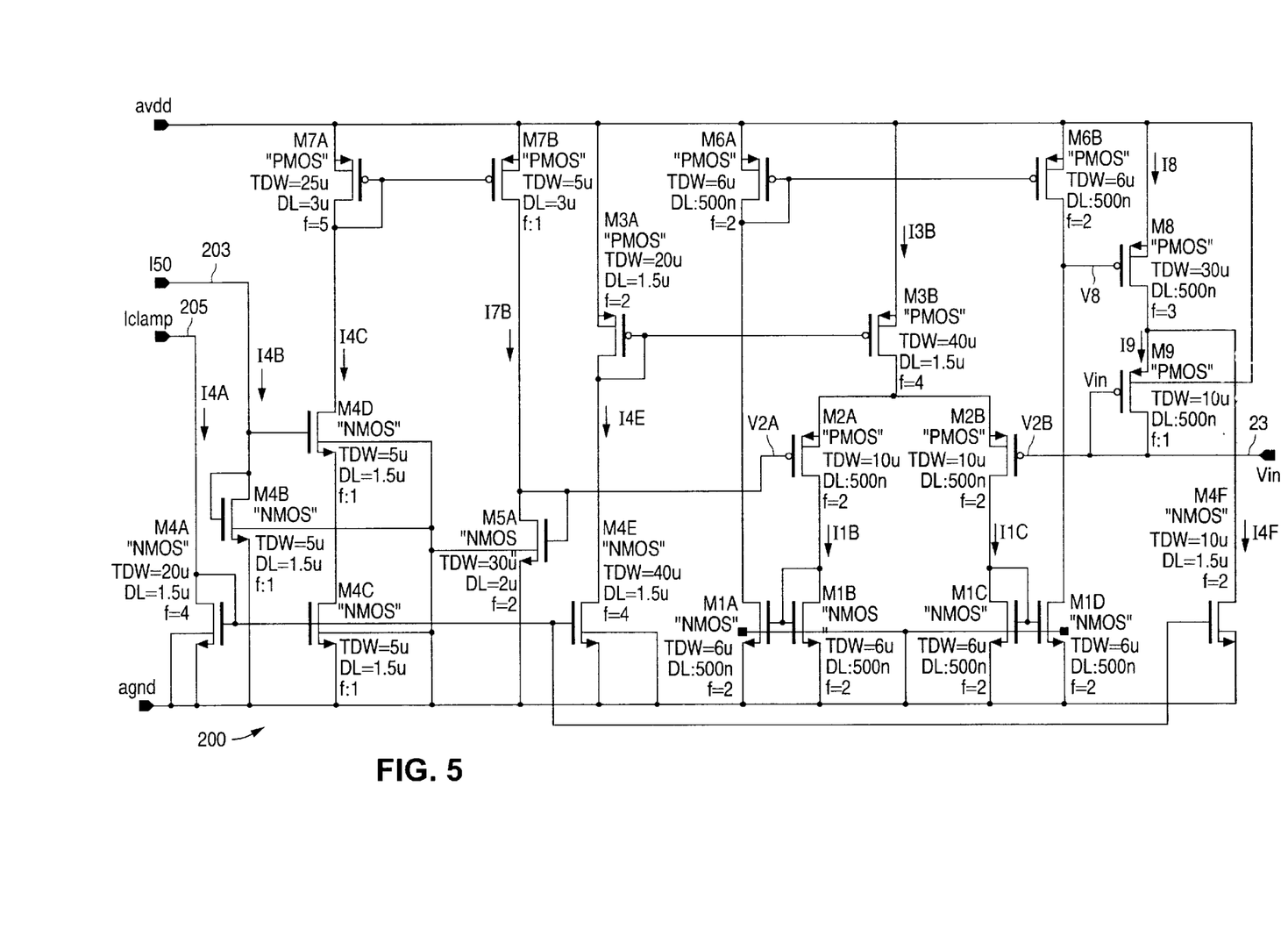
FIG. 5 is a schematic diagram of the current clamp circuit used in the circuit of FIG. 3.

Referring to FIG. 4, one possible implementation of the V:I converter 140 includes two current source circuits 140a, 140b that serve as current sinks for the output control currents 141a, 141b. Each circuit 140a, 140b includes an N-type metal oxide semiconductor (NMOS) field effect transistor (MOSFET) M1A, M1B which is biased by the input control voltage 23. The bias generated by this voltage 23 establishes the respective output currents 141a, 141b through the series of resistive circuit elements R1A, R2A, R3A, R4A, R1B, R2B, R7B, R8B. (In accordance with well-known circuit techniques, these resistive elements can be implemented using appropriately biased MOSFETs.) Referring to FIG. 5, the current clamp circuit 200 of FIG. 3 is preferably implemented as shown. The semiconductor devices used in this circuit 200 are of like kind as those used in the V:I converter 140 (FIG. 4), and all such devices are integrated within the integrated circuit containing the VCO 116. These devices include both NMOS transistors (e.g., transistor M1A) and PMOS transistors (e.g., transistor M2A).

The core of this circuit 200 is a differential amplifier formed by transistors M2A and M2B which are biased with a tail current I3B generated by transistor M3B. As will be described in more detail, this differential amplifier is biased and otherwise driven by a succession of current mirror circuits, which successively scale down, or attenuate, the input clamping current 205.

The input clamping current 205 provides the input current I4A for a current mirror circuit formed by transistors M4A, M4C, M4E and M4F. This current I4A is replicated, or mirrored, as currents I4C, I4E and I4F. Due to the difference in channel width dimensions of the various transistors M4A, M4C, M4E, M4F (as indicated in FIG. 5), currents I4C and I4F are proportionately smaller and current I4E is proportionately greater than I4A, in accordance with well-known current mirror operation. Current I4C is mirrored by another current mirror formed by transistors M7A and M7B to generate current I7B which drives transistor M5A. Transistor M5A has a threshold voltage such that the voltage V2A at its commonly connected gate and drain terminals and at the gate terminal of transistor M2A, is slightly less than the voltage appearing at the gate terminals of transistors M1A and M1B of the current source circuits 140a, 140b in the V:I converter 140 (FIG. 4).

With no external voltage applied at the input 23 of the V:I 140 (such as during the free run operation of the VCO 116), the differential amplifier transistors M2A, M2B operate in accordance with conventional differential amplifier operation to cause the voltage V2B at the gate of transistor M2B to equal the voltage V2A at the gate terminal of transistor M2A. Hence, this output voltage V2B is determined by the input clamping current 205. Plus, since this input current I4A is scaled down due to the scaling action of the current mirror formed by transistors M4A and M4C and the current mirror formed by transistors M7A and M7B, any variations or noise introduced into this input current I4A is also reduced, thereby reducing any potential phase jitter which might otherwise result from variations in the gate terminal voltages V2A, V2B.

Bias current 203 forms the input current I4B for a diode-connected transistor M4B which biases transistor M4D. This transistor M4D provides isolation for current mirror transistor M4C to minimize any effects upon mirrored current I4C due to variations in the power supply voltage VDD.

During the free run, or unmodulated, mode of operation of the VCO 116, the externally applied voltage at the input 23 of the V:I converter 140, which is also the output terminal of the current clamp circuit 200, tends to decrease. Ultimately, this voltage may seek a level below that which is desired, i.e., voltage V2A. When this begins to occur, diode-connected transistor M9 is turned on, thereby pulling this terminal 23 back to maintain equality of voltages V2A and V2B.

The tail current I3B for the differential amplifier, under normal operating conditions, is evenly split between transistors M2A and M2B, thereby resulting in equal input currents I1B and I1C for the current mirror circuits formed by transistors M1A and M1B and transistors M1C and M1D. Together, these circuits bias another current mirror circuit formed by transistors M6A and M6B which generates the bias voltage V8 at the gate of transistor M8. This maintains transistor M8 in an on state at all times due to the constant bias current I4F provided by transistor M4F. Mirrored current I4F is used to maintain the flow of current I8 through transistor M8 so that when the voltage at the output terminal 23 begins to fall below voltage V2A, transistor M9 will turn on quickly, thereby maintaining voltage V2B equal to voltage V2A, as described above.

Based upon the foregoing discussion, it should be understood that the free run frequency of the VCO 116 is determined by the output voltage V2B of the current clamp circuit 200. In turn, this voltage V2B is established by the input clamping current 205. Further, due to the scaling down action of the succession of current mirror circuits used to drive transistor M5A which establishes voltage V2A, and therefore, in turn, also establishes voltage V2B, any variations or noise introduced into the clamping current 205 are significantly reduced. This significantly reduces any effects upon the free run frequency of the VCO 116.

Additionally, due to the use of both NMOS and PMOS transistors in generating the output voltage V2B, any variations in the operating characteristics of these devices caused by variations in the operating temperature or processes of fabrication of these devices will be significantly reduced since they will tend to counteract each other.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated circuit with a voltage-controlled oscillator that provides an oscillation signal with an unmodulated frequency that remains constant in response to reception of a bias current having a constant magnitude and with a modulated frequency that varies in response to reception of a modulation voltage, said integrated circuit comprising:

a current-to-voltage conversion circuit that includes a portion of a plurality of integrated, like semiconductor devices with a plurality of operating characteristics and that generates, in response to reception of a bias current, a control voltage with a magnitude corresponding to a magnitude of said bias current;

a voltage-to-current conversion circuit that includes another portion of said plurality of integrated, like semiconductor devices, that is coupled to said current-to-voltage conversion circuit and that generates, in response to reception of said control voltage and a modulation voltage, a control current with a magnitude that corresponds to a magnitude of said modulation voltage during reception of said modulation voltage, and corresponds to said control voltage magnitude otherwise; and a current-controlled oscillator circuit that includes still another portion of said plurality of integrated, like semiconductor devices, that is coupled to said voltage-to-current conversion circuit and that generates, in response to reception of said control current, an oscillation signal with an unmodulated frequency corresponding to said bias current magnitude and with a modulated frequency corresponding to said modulation voltage;

wherein said unmodulated frequency is defined by said bias current magnitude substantially irrespective of variations in respective ones of said plurality of operating characteristics caused by variations in operating temperatures and processes of fabrication of said plurality of integrated, like semiconductor devices.

2. The apparatus of claim 1, wherein said current-to-voltage conversion circuit comprises a current attenuation circuit that generates, in response to reception of said bias current, an attenuated current with a magnitude proportionately less than said bias current magnitude and that generates said control voltage with a magnitude which is dependent upon said attenuated current magnitude.

3. The apparatus of claim 2, wherein said current attenuation circuit comprises a plurality of current mirror circuits that are successively coupled and that generate, in response to reception of said bias current, a plurality of successively scaled currents with successively reduced magnitudes.

4. The apparatus of claim 1, wherein said current-to-voltage conversion circuit comprises:

a reference voltage generator circuit that generates, in response to reception of said bias current, a reference voltage derived from a threshold voltage of one of said plurality of integrated, like semiconductor devices; and a differential amplifier circuit, coupled to said reference voltage generator circuit, that selectively generates, in response to said reference voltage, said control voltage with said control voltage magnitude being related to said reference voltage.

5. The apparatus of claim 4, wherein said current-to-voltage conversion circuit further comprises:

an output terminal, coupled between said differential amplifier circuit and said voltage-to-current conversion circuit, that alternately conveys said control voltage and said modulation voltage; and an output circuit stage, coupled to said output terminal, that drives said output terminal with said reference voltage when said modulation voltage magnitude is less than a predetermined value, and is disabled from driving said output terminal otherwise.

6. The apparatus of claim 1, wherein said voltage-to-current conversion circuit comprises a voltage-controlled current generator circuit, coupled between said current-to-voltage conversion circuit and said current-controlled oscillator circuit, that includes:

a resistive circuit that conducts said control current; and one of said plurality of integrated, like semiconductor devices that generates said control current in response to reception of said control voltage and said modulation voltage.

7. The apparatus of claim 1, wherein said current-to-voltage conversion circuit comprises:

an output terminal, coupled to said voltage-to-current conversion circuit, that alternately conveys said control voltage and said modulation voltage; and an output circuit stage, coupled to said output terminal, that drives said output terminal with: a reference voltage when said modulation voltage magnitude is less than a predetermined value, and is disabled from driving said output terminal otherwise.

8. An apparatus including an integrated circuit with a voltage-controlled oscillator that provides an oscillation signal with an unmodulated frequency that remains constant in response to reception of a bias current having a constant magnitude and with a modulated frequency that varies in response to reception of a modulation voltage, said integrated circuit comprising:

current-to-voltage conversion means that includes a portion of a plurality of integrated, like semiconductor means with a plurality of operating characteristics for receiving a bias current and in response thereto generating a control voltage with a magnitude corresponding to a magnitude of said bias current;

voltage-to-current conversion means that includes another portion of said plurality of integrated, like semiconductor means for receiving said control voltage and a modulation voltage and in response thereto generating a control current with a magnitude that corresponds to a magnitude of said modulation voltage during reception of said modulation voltage, and corresponds to said control voltage magnitude otherwise; and current-controlled oscillator means that includes still another portion of said plurality of integrated, like semiconductor means for receiving said control current and in response thereto generating an oscillation signal with an unmodulated frequency corresponding to said bias current magnitude and with a modulated frequency corresponding to said modulation voltage;

wherein said unmodulated frequency is defined by said bias current magnitude substantially irrespective of variations in respective ones of said plurality of operating characteristics caused by variations in operating temperatures and processes of fabrication of said plurality of integrated, like semiconductor means.

9. The apparatus of claim 8, wherein said current-to-voltage conversion means comprises current attenuation means for receiving said bias current and in response thereto generating an attenuated current with a magnitude proportionately less than said bias current magnitude and generating said control voltage with a magnitude which is dependent upon said attenuated current magnitude.

10. The apparatus of claim 9, wherein said current attenuation means comprises a plurality of current mirror means for receiving said bias current and in response thereto generating a plurality of successively scaled currents with successively reduced magnitudes.

11. The apparatus of claim 8, wherein said current-to-voltage conversion means comprises:
  reference voltage generator means for receiving said bias current and in response thereto generating a reference voltage derived from a threshold voltage of one of said plurality of integrated, like semiconductor devices; and
  differential amplifier means for receiving said reference voltage and in response thereto selectively generating said control voltage with said control voltage magnitude being related to said reference voltage.

12. The apparatus of claim 11, wherein said current-to-voltage conversion means further comprises:
  output terminal means for alternately conveying said control voltage and said modulation voltage; and
  output driver means for
    driving said output terminal with said reference voltage when said modulation voltage magnitude is less than a predetermined value, and
    becoming disabled from driving said output terminal otherwise.

13. The apparatus of claim 8, wherein said voltage-to-current conversion means comprises voltage-controlled current generator means including:
  resistive means for conducting said control current; and
  one of said plurality of integrated, like semiconductor means for receiving said control voltage and said modulation voltage and in response thereto generating said control current.

14. The apparatus of claim 8, wherein said current-to-voltage conversion means comprises:
  output means for alternately conveying said control voltage and said modulation voltage; and
  output driver means for
    driving said output terminal with a reference voltage when said modulation voltage magnitude is less than a predetermined value, and
    becoming disabled from driving said output terminal otherwise.

15. A method of generating an oscillation signal with an unmodulated frequency that remains constant in response to reception of a bias current having a constant magnitude and with a modulated frequency that varies in response to reception of a modulation voltage, comprising:
  receiving a bias current;
  operating a portion of a plurality of integrated, like semiconductor devices with a plurality of operating characteristics to generate a control voltage with a magnitude corresponding to a magnitude of said bias current;
  receiving a modulation voltage;
  operating another portion of said plurality of integrated, like semiconductor devices to generate a control current with a magnitude that
    corresponds to a magnitude of said modulation voltage during reception of said modulation voltage, and
    corresponds to said control voltage magnitude otherwise; and
  operating still another portion of said plurality of integrated, like semiconductor devices in response to said control current to generate an oscillation signal with an unmodulated frequency corresponding to said bias current magnitude and with a modulated frequency corresponding to said modulation voltage;
  wherein said unmodulated frequency is defined by said bias current magnitude substantially irrespective of variations in respective ones of said plurality of operating characteristics caused by variations in operating temperatures and processes of fabrication of said plurality of integrated, like semiconductor devices.

16. The method of claim 15, wherein said step of operating a portion of a plurality of integrated, like semiconductor devices with a plurality of operating characteristics to generate a control voltage with a magnitude corresponding to a magnitude of said bias current comprises:
  generating an attenuated current with a magnitude proportionately less than said bias current magnitude, and
  generating said control voltage with a magnitude which is dependent upon said attenuated current magnitude.

17. The method of claim 16, wherein said step of generating an attenuated current with a magnitude proportionately less than said bias current magnitude comprises generating a plurality of successively scaled currents with successively reduced magnitudes.

18. The method of claim 15, wherein said step of operating a portion of a plurality of integrated, like semiconductor devices with a plurality of operating characteristics to generate a control voltage with a magnitude corresponding to a magnitude of said bias current comprises:
  generating, in response to reception of said bias current, a reference voltage derived from a threshold voltage of one of said plurality of integrated, like semiconductor devices; and
  selectively generating, in response to said reference voltage, said control voltage with said control voltage magnitude being related to said reference voltage.

19. The method of claim 18, wherein said step of operating a portion of a plurality of integrated, like semiconductor devices with a plurality of operating characteristics to generate a control voltage with a magnitude corresponding to a magnitude of said bias current comprises:
  alternately conveying said control voltage and said modulation voltage via an output terminal;
  driving said output terminal with said reference voltage when said modulation voltage magnitude is less than a predetermined value; and
  terminating said driving of said output terminal otherwise.

20. The method of claim 15, wherein said step of operating another portion of said plurality of integrated, like semiconductor devices to generate a control current comprises:
  resistively conducting said control current; and
  operating said another portion of said plurality of integrated, like semiconductor devices to generate said control current in response to reception of said control voltage and said modulation voltage.

21. The method of claim 15, wherein said step of operating a portion of a plurality of integrated, like semiconductor devices with a plurality of operating characteristics to generate a control voltage with a magnitude corresponding to a magnitude of said bias current comprises:
  alternately conveying said control voltage and said modulation voltage via an output terminal;
  driving said output terminal with a reference voltage) when said modulation voltage magnitude is less than a predetermined value; and
  terminating said driving of said output terminal otherwise.

* * * * *

UNITED STATES PATENT AND TRADEMARK OFFICE
CERTIFICATE OF CORRECTION

PATENT NO.   : 6,515,552 B1  
DATED        : February 4, 2003  
INVENTOR(S)  : Chiu et al.

It is certified that error appears in the above-identified patent and that said Letters Patent is hereby corrected as shown below:

Column 8,
Line 62, remove ")".

Signed and Sealed this

Twenty-seventh Day of May, 2003

JAMES E. ROGAN
*Director of the United States Patent and Trademark Office*